US010680583B1

(12) United States Patent
Kamath et al.

(10) Patent No.: US 10,680,583 B1
(45) Date of Patent: Jun. 9, 2020

(54) CONTROL CIRCUIT FOR AND METHOD OF CONTROLLING AN OPERATION OF AN INTEGRATED CIRCUIT DEVICE

(71) Applicant: Xilinx, Inc., San Jose, CA (US)

(72) Inventors: Umanath R. Kamath, Dublin (IE); Diarmuid Collins, Dunshaughlin (IE); Edward Cullen, Naas (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/286,489

(22) Filed: Feb. 26, 2019

(51) Int. Cl.
*G05F 1/56* (2006.01)
*G06F 1/00* (2006.01)
*H02M 3/156* (2006.01)
*H03K 3/012* (2006.01)
*G06F 1/04* (2006.01)

(52) U.S. Cl.
CPC ............... *H03K 3/012* (2013.01); *G06F 1/04* (2013.01)

(58) Field of Classification Search
CPC combination set(s) only.
See application file for complete search history.

(56) References Cited

U.S. PATENT DOCUMENTS

| 7,342,392 | B2 * | 3/2008 | Liao | H02M 1/08 323/282 |
| 7,476,668 | B2 * | 1/2009 | Graindorge | C07D 513/04 514/222.8 |
| 8,384,472 | B2 | 2/2013 | Cical | |
| 9,509,307 | B1 | 11/2016 | Santurkar | |
| 9,935,597 | B2 | 4/2018 | Erdmann | |

* cited by examiner

*Primary Examiner* — An T Luu
(74) *Attorney, Agent, or Firm* — John J. King

(57) ABSTRACT

A control circuit used in an integrated circuit device is described. The control circuit comprises a startup timer configured to generate a startup timing signal; a startup circuit configured to generate a startup control signal; and a switching element coupled between the startup circuit and a load; wherein the switching element applies the startup control signal to the load during a startup period associated with the startup timing signal. A method of controlling an operation of an integrated circuit device is also described.

20 Claims, 6 Drawing Sheets

US 10,680,583 B1

CONTROL CIRCUIT FOR AND METHOD OF CONTROLLING AN OPERATION OF AN INTEGRATED CIRCUIT DEVICE

TECHNICAL FIELD

The present invention relates generally to integrated circuit devices, and in particular, to a control circuit for and a method of controlling an operation of an integrated circuit device.

BACKGROUND

Self-biased control loops such as bandgap circuits and self-biased operational transconductance amplifiers (OTAs) can exhibit different operating points when powered up. For example, one operating point may occur where current flows (e.g. a normal desired operation), and another may occur where no current flows. To avoid the operating point where no current flows, a startup circuit may be required to inject current into the loop when powering up. Once the correct operating point has been reached, the startup circuit would be switched out to allow the normal behavior of the loop to take over. The switching in and out of the startup circuit is typically controlled using an analog closed loop circuit.

However, the use of an analog closed loop circuit for switching in and out the startup circuit introduces another loop (i.e. startup loop) into the circuit. When implementing such a circuit arrangement, effort must be taken to minimize the gain of this additional loop to prevent it rendering the circuit unstable. In startup loops where an inverter may be required, maintaining a stable circuit can become very challenging due to the high gain of the inverter.

Accordingly, there is a need for a circuit for controlling startup in an integrated circuit device that overcomes the deficiencies of conventional startup circuits in integrated circuit devices.

SUMMARY

A control circuit used in an integrated circuit device is described. The control circuit comprises a startup timer configured to generate a startup timing signal; a startup circuit configured to generate a startup control signal; and a switching element coupled between the startup circuit and a load; wherein the switching element applies the startup control signal to the load during a startup period associated with the startup timing signal.

A method of controlling an operation of an integrated circuit device is also described. The method comprises configuring a startup timer to generate a startup timing signal; configuring a startup circuit to generate a startup control signal; and coupling a switching element between the startup circuit and a load; wherein the switching element applies the startup control signal to the load during a startup period associated with the startup timing signal.

DETAILED DESCRIPTION

Self-biased control loops may require startup circuits to prevent them settling in an operating point where no current flows. While the control of these startup circuits may be achieved using an analog closed loop, the addition of another loop may create stability issues, particularly where high gain elements are used in the circuit. The circuits and methods set forth below control the startup circuit using a time-based approach, which eliminates the need for another loop and so has little or no effect on stability. According to some implementations, the startup circuit may be a digital time-based control circuit. More particularly, the circuits and methods set forth below control the startup circuit of an integrated circuit device, such as of an analog block. The circuits and methods provide a time-based approach to achieves open loop control, thereby avoiding stability risks associated with conventional closed loop analog approaches. According to some implementations, the invention presents a time-based, digital approach (i.e. based upon a number of clock signals) to controlling a startup circuit, By characterizing the startup behavior of critical nets in the loop, the time it takes for the loop to startup over all possible conditions can be determined. From this characterization, worst case startup times (i.e. a determined worse case over a number of loads) can be provided to digital circuitry to control a startup circuit. This digital time-based approach eliminates the need for another loop; and does not affect stability.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
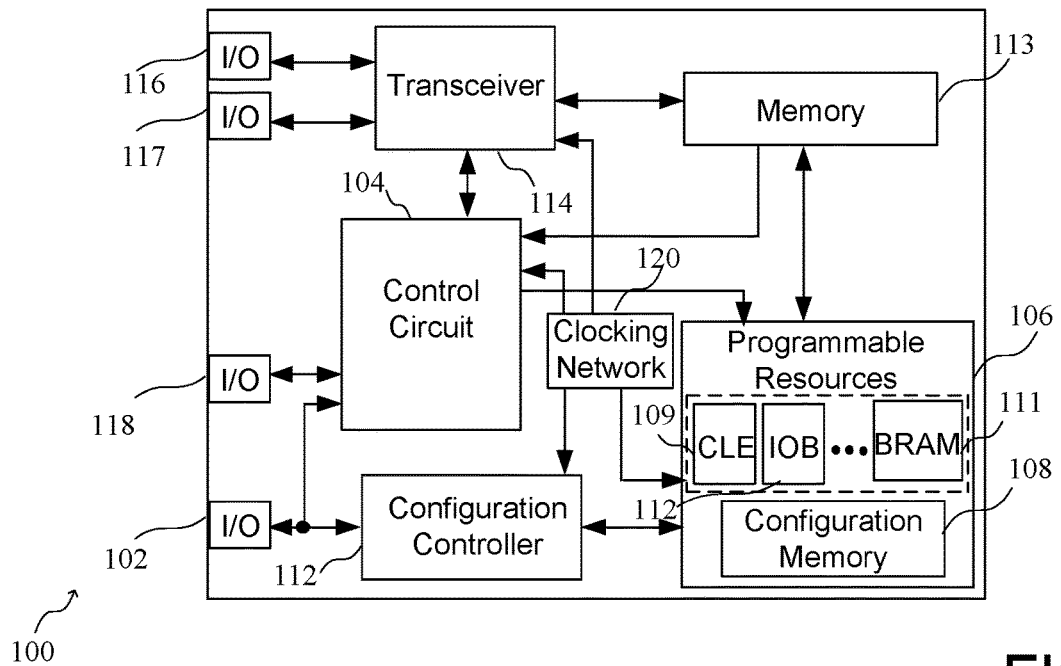
FIG. 1 is a block diagram of an integrated circuit having circuits that may require startup control.

Turning first to FIG. 1, a block diagram of an integrated circuit having circuits that may require a voltage divider is shown. In particular, an input/output port 102 is coupled to a control circuit 104 that controls programmable resources 106, shown here by way of example as having different types of programmable resources, such as configurable logic elements 109, input/output blocks (IOBs) 110 and blocks of random access memory (BRAMs) 111. Configuration data may be provided to the configuration memory 108 by a configuration controller 112. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuit of FIG. 1 includes examples of circuits that may require DC voltages to be stepped down, such as in an input/output port for example. While the circuit of FIG. 1 is provided by way of example, other circuits may be used to implement circuits providing startup control.

Self-biased control loops, such as bandgaps and self-biased operational transconductance amplifiers (OTAs), can exhibit two operating points when powered up, including one where current flows (normal desired operation), and one where no current flows. To avoid the operating point where no current flows, a startup circuit may be required to inject current into the loop, such as when powering up. Once the correct operating point has been reached, the startup circuit is generally switched out to allow the loops normal behavior to take over. While the switching in and out of the startup circuit could be controlled using an analog closed loop, such an approach introduces another loop (i.e. a startup loop) into the circuit. However, care must be taken to minimize the gain of this startup loop to prevent it rendering the circuit unstable. In startup loops where an inverter is required, this can become very challenging due to the high gain of the inverter. As will be described in more detail in reference to FIG. 2, a time-based circuit provides an open-loop arrangement and therefore avoids disadvantages of a closed loop arrangement.

Figure 2:
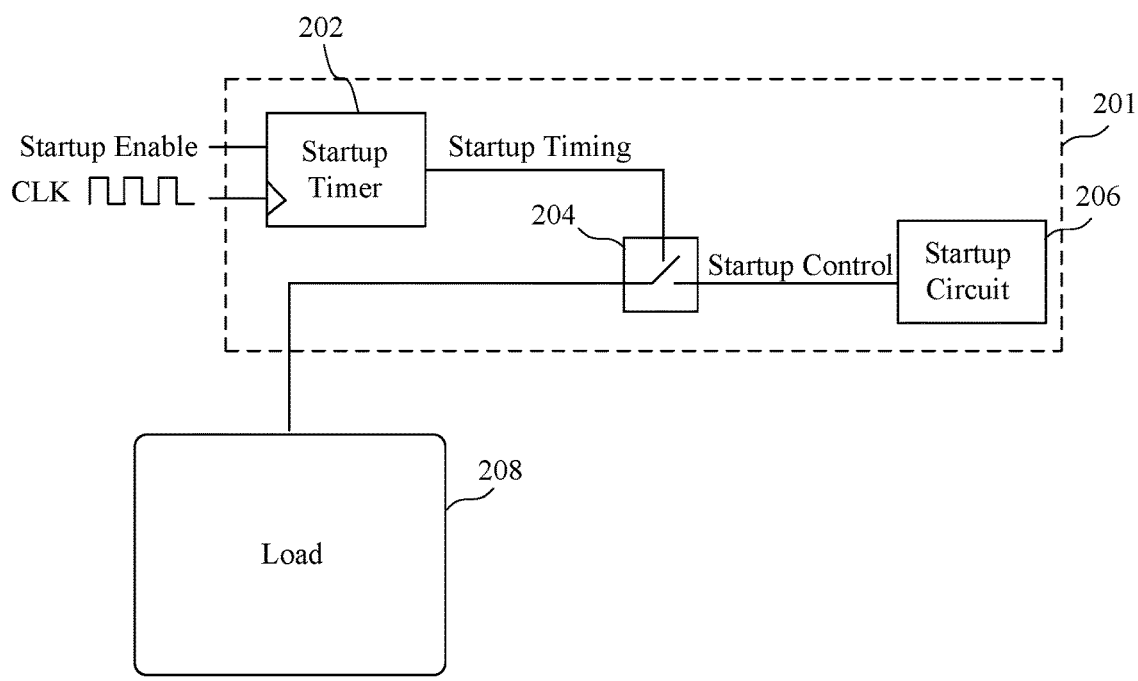
FIG. 2 is a block diagram of a circuit for providing startup control in an integrated circuit device.

Turning now to FIG. 2, a block diagram of a circuit 200 for providing startup control in an integrated circuit device is shown. The circuit 200 comprises a startup control block 201 having a startup timer 202 configured to control a switching circuit 204 that enables a startup circuit 206 to control a load 208 using a startup control circuit. The startup timer 202 is configured to receive a clock signal (CLK) at a clock input, and generates a control signal, shown here as a startup timing (Startup Timing) signal, coupled to control the switch 204. By way of example, the switch 204 could comprise a transistor switch, such as a metal oxide semiconductor (MOS) switch. The startup timer 202 may also be configured to receive a startup enable (Startup Enable) signal to enable generating a startup timing signal. For example, the startup timing signal, shown here by way of example as an active low signal, could be generated during a startup or reset operation, or any other condition or operation that would require the application of a startup control signal to a load. The startup control block 201 may comprise a digital time-based startup circuit, as will be described in more detail below, and generates a startup control signal. The load may comprise any load that requires a startup control signal, or any type of switching element, such as a voltage-to-current converter circuit, a startup injection circuit, or a bandgap circuit for example. It should be noted that the startup control block 201 could be implemented in elements of the integrated circuit of FIG. 1, including for example the programmable resources 106 of FIG. 1.

Figure 3:
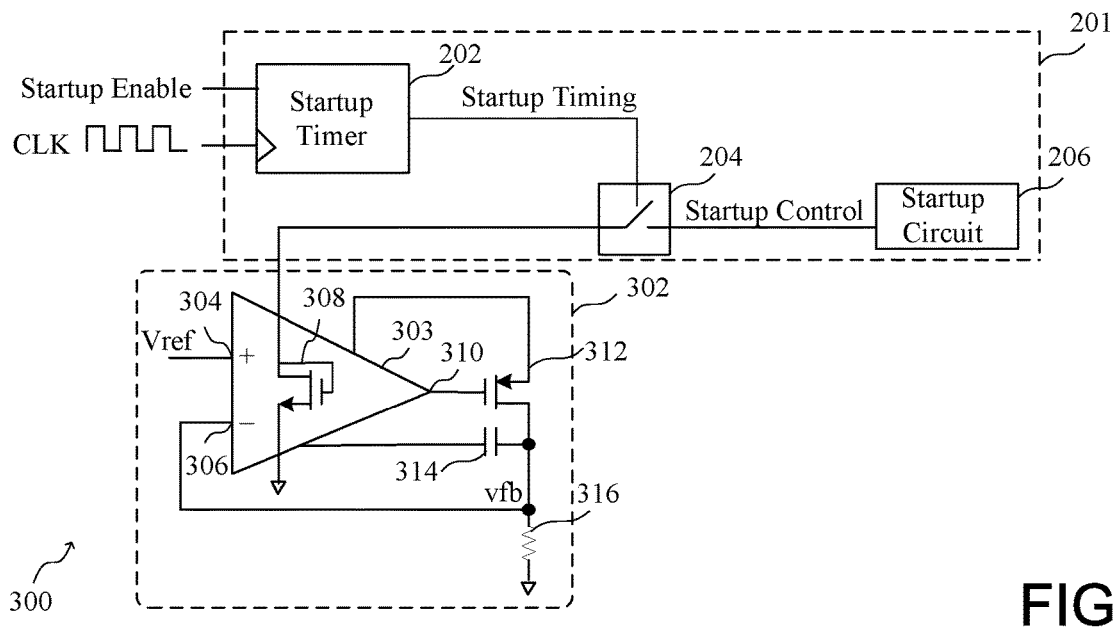
FIG. 3 is another block diagram of a circuit for providing startup control in an integrated circuit device.

Turning now to FIG. 3, another block diagram of a circuit 300 for providing startup control in an integrated circuit device is shown. As shown in FIG. 3, the load 302 comprises an operational transconductance amplifier (OTA) circuit. More particularly, an amplifier 303 comprises a first input 304 coupled to receive a reference voltage (Vref) and a second input 306 coupled to receive a feedback signal. The load 302 comprises a transconductance transistor 308 that is controlled by the startup timer 202 in response to the control of the switch 204. It should be noted that the transistor 302 is shown as a representative portion of an OTA circuit, which could be implemented in a variety of arrangements to generate an amplified output signal at an output 310. Transistor 308 is provided to show that a circuit element of the amplifier may be controlled to control the output signal. An output of the amplifier 303 is coupled to a gate of a transistor 312. The transistor 312 may have a source coupled to an output of the amplifier 303, which may be a reference voltage output for example. A capacitor 314 may be coupled between another output of the amplifier 303, which may be another reference voltage output, and a resistor 316.

Figure 4:
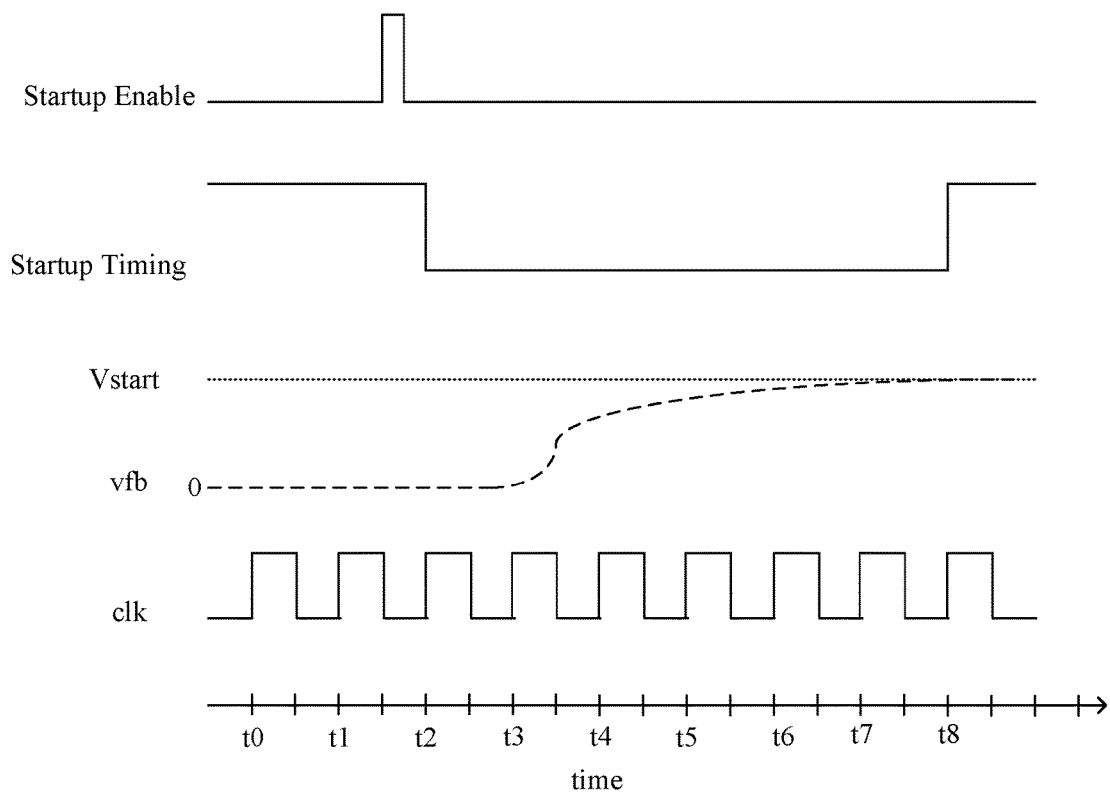
FIG. 4 is a timing diagram showing the operation of a circuit for providing startup control in an integrated circuit device.

Turning now to FIG. 4, a timing diagram shows the operation of a circuit for providing startup control in an integrated circuit device. As shown in FIG. 4, during a startup period, it may be necessary to generate a known voltage at a certain node. For example, in FIG. 3, it may be necessary to bring the feedback node (Vfb) at the resistor 316 to a predetermined voltage, shown here by way of example as Vstart. Unlike a conventional device that may periodically check the voltage at the node to determine whether the feedback node has reached the desired voltage, the circuit of FIG. 3 will provide a signal to the load 302 to bring the feedback node to the predetermined voltage. According to the example of FIGS. 3 and 4, the startup timer 202 will close the switch 204 in response to the startup enable signal to allow the startup circuit 206 to provide an electrical signal, such as a certain current or voltage to the load 302, during the period while the startup timing signal is high, which may be for a predetermined number of clock cycles (e.g. the clock cycles between $t_2$ and $t_6$). It should be understood that the current or voltage could be a fixed current or voltage or a variable current or voltage, for example. As shown in the example of FIG. 4, it takes approximately 6 clock cycles (i.e. $t_2$-$t_8$) for the voltage at the feedback node to reach the desired voltage Vstart, where the startup voltage Vstart is known as a startup time. The value of the startup time could be determined empirically for example, or through other means, such as through estimation based upon known characteristics of the circuit or the operation of similar circuits. Startup times can be based on a worst-case analysis. However, to add further robustness, programmability can be included (e.g. startup time=80 clks±16 clks).

Figure 5:
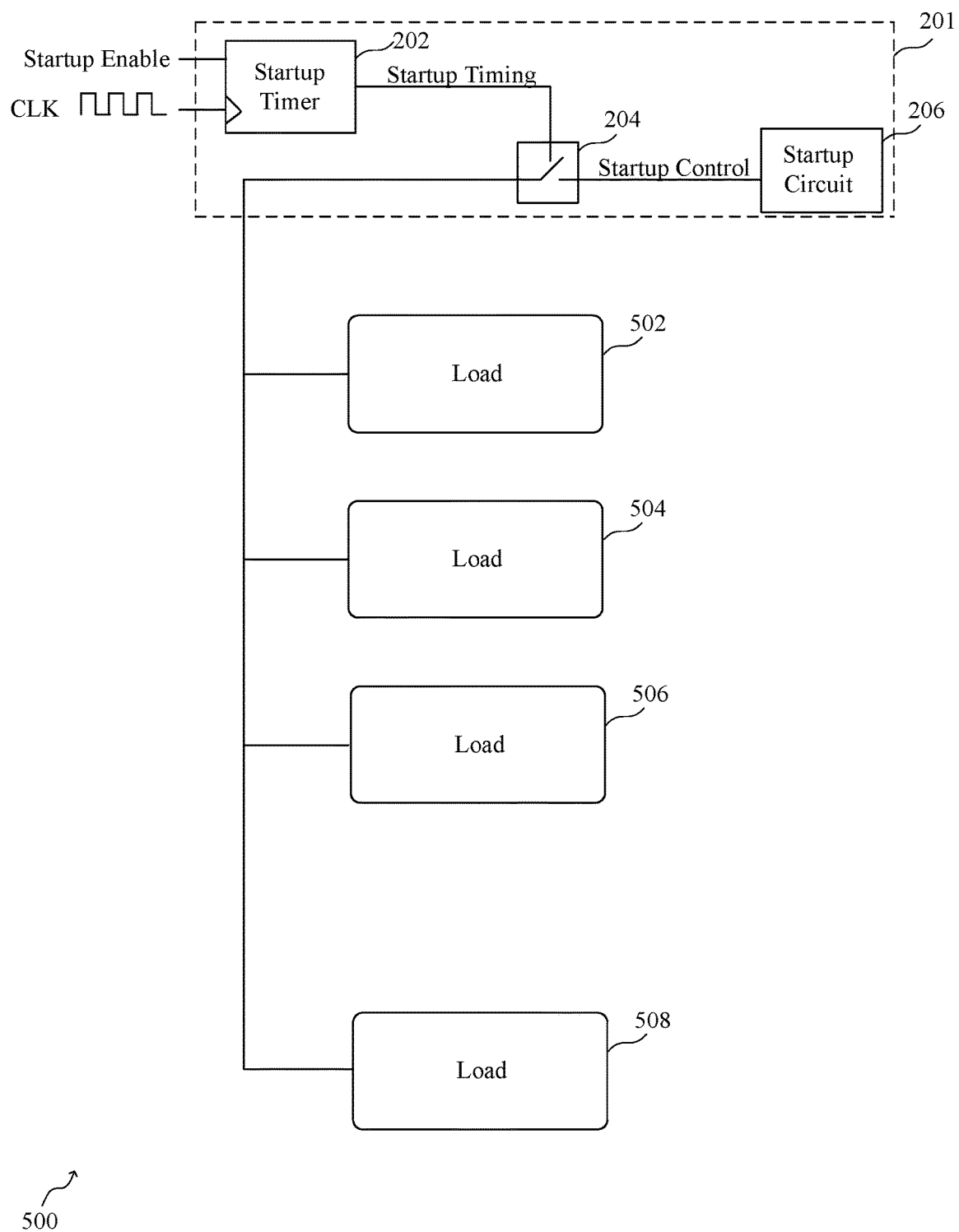
FIG. 5 is a block diagram of a circuit for providing startup control for a plurality of loads in an integrated circuit device.
Figure 6:
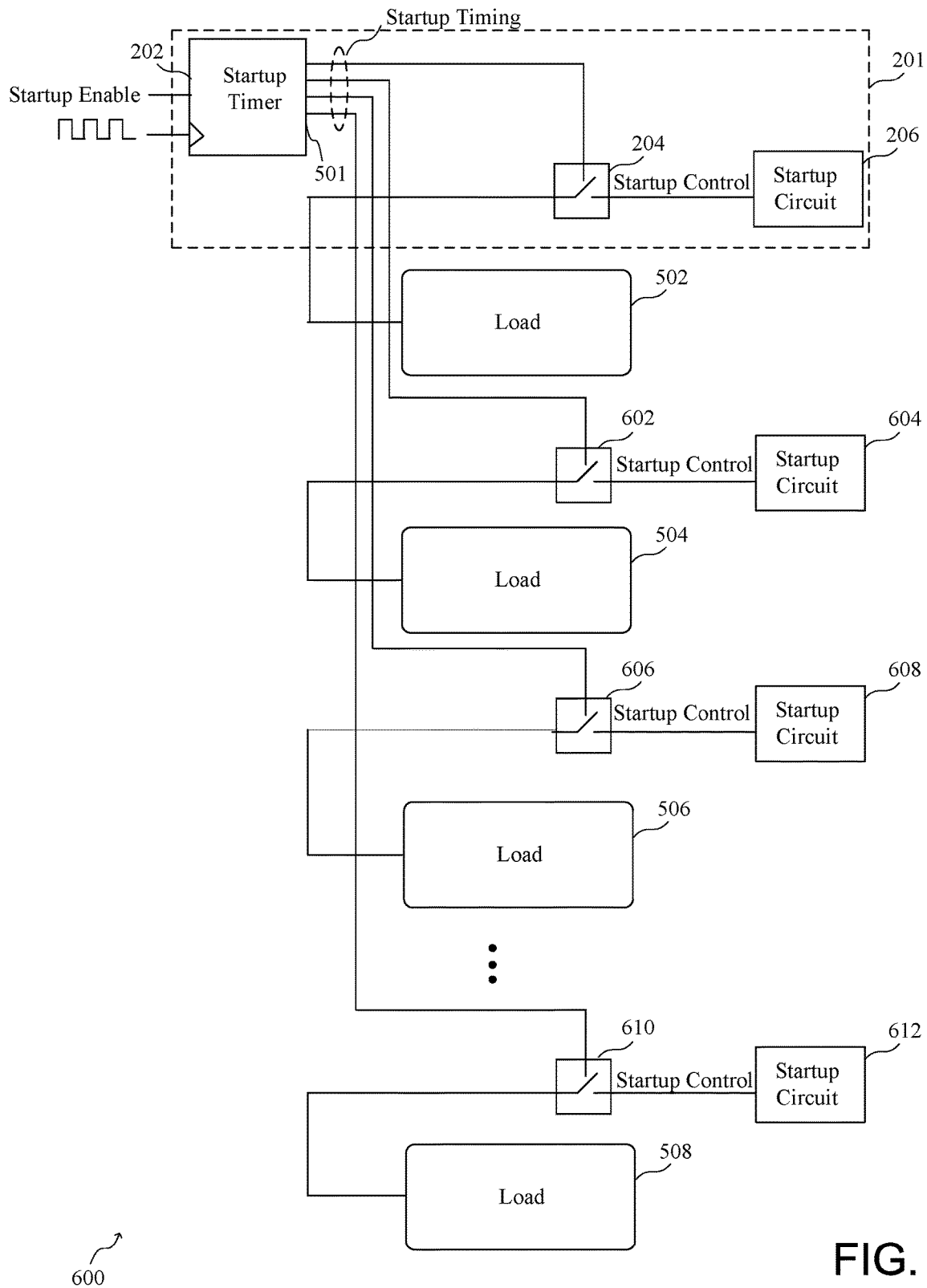
FIG. 6 is a block diagram of another circuit for providing startup control for a plurality of loads in an integrated circuit device.

Turning now to FIG. 5, a block diagram of a circuit 500 for providing startup control for a plurality of loads in an integrated circuit device is shown. According to the implementation of FIG. 5, the output of the startup circuit, generated in response to the closing of the switch 204, is provided to a plurality of loads 502-508. Accordingly, a startup control circuit can provide the same startup signal to the loads. According to the implementation of FIG. 6, a single startup control circuit can be implemented in the circuit 600 to control pairs of startup circuits and corresponding switches that provide a startup signal, where each startup circuit and corresponding switch controlled by the single startup control circuit controls one or more loads. More particularly, the circuit 600 provides startup control for a plurality of loads controlled by a plurality of a startup circuits and corresponding switches using a plurality of outputs signals generated at an output 501. For example, a first load 502 is configured to receive an output of the startup circuit 206 (i.e. a startup control signal) in response to a startup timing signal sent to a switch 204. However, in addition to the first load 502, other loads can also be controlled by the startup control block 201 using a startup circuit and switch for that load. For example, the load 504 can be controlled by a switch 602 that is configured to receive a startup timing signal from the startup timer 202 and configured to receive a startup control signal from a corresponding startup circuit 604. Similarly, the load 506 can be controlled by a switch 606 that is configured to receive a startup timing signal from the startup timer 202 and a startup control signal from a corresponding startup circuit 608, and the load 508 can be controlled by a switch 610 that is configured to receive a startup timing signal from the startup timer 202 and a startup control signal from a corresponding startup circuit 702. While a single startup timer 202 is shown, it should be understood that multiple startup timers could be implemented, where each startup timer may be coupled to any number of loads, where the number of loads may be different. For example, the circuit of FIG. 6 may be implemented multiple times in different locations of the integrated circuit, where the number of loads controlled by the startup timer may vary.

Figure 7:
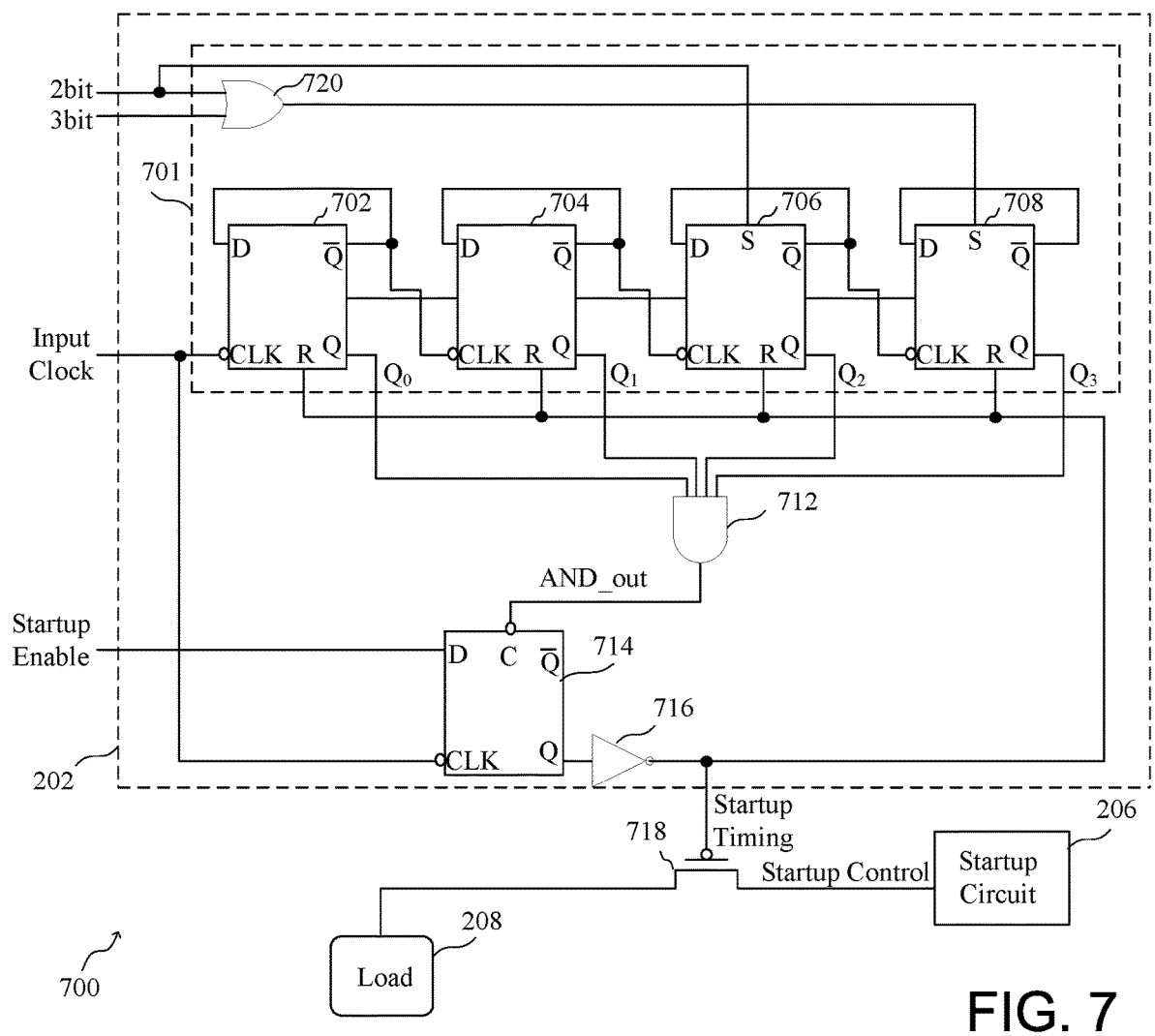
FIG. 7 is a block diagram of an exemplary startup timer that could be implemented in an integrated circuit that may require startup control.

Turning now to FIG. 7, a block diagram of an exemplary circuit 700 having a counter that may be used in a startup timer, such as startup timer 202 implemented in an integrated circuit that may require startup control, is shown. A counter 701 of FIG. 7 may be implemented in the startup timer 202 to generate a count that may be used to establish the duration of the startup timing signal. The counter 701 is configured to receive an input clock (Input Clock) signal and generate an output count $Q_0$-$Q_3$. More particularly, the counter 701 comprises a plurality of registers coupled in series to generate a corresponding plurality of output signals associated with the count. According to the implementation of FIG. 7, the registers are D-type flip-flops (DFFs) having a clock (CLK) input, a data (D) input, a first output (Q_bar) and a second output (Q) to generate output signals, where the signal generated at the first output Q_bar if feed back to the data input. The output of the register may toggle at a frequency of the input clock divided by 2. A first register 702 is configured to receive the input clock and generate a first output signal $Q_0$, which may toggle at half the input clock frequency. A second register 704 is configured to receive an output signal from the first output Q-bar of the first register 702 at a clock input and generate a second output signal $Q_1$, which may toggle at one quarter of the input clock frequency. A third register 706 is configured to receive an output signal from the first output Q-bar of the second register 704 and generate a third output signal $Q_2$, which may toggle at one eighth of the input clock frequency. A fourth register 708 is configured to receive an output signal from the first output Q-bar of the third register 706 and generate a fourth output signal $Q_4$, which may toggle at one sixteenth of the input clock frequency. A count from 0 to 16 can be generated based upon the outputs $Q_0$-$Q_3$, and may be used to establish the startup timing signal generated by the startup timer, as shown in the following Table 1.

TABLE 1

| Q3 | Q2 | Q1 | Q0 | Count # |
|---|---|---|---|---|
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 0 | 0 | 14 |
| 1 | 1 | 1 | 1 | 15 |

The outputs $Q_0$-$Q_3$ are provided to inputs of an AND 712, and output of which is a control signal (AND_out) for controlling the startup timing signal. The AND_out signal generated at the output of the AND gate is provided to a clear (C) input of a register 714, shown here by way of example as a DFF. The Q output of the register 714 is provided to an inverter 716, an output of which is the startup timing signal. According to the implementation of FIG. 7, a switch 718, shown here by way of example as a PMOS transistor, is coupled to receive startup timing signal at its gate. The switch 718 operates in a similar manner as the switch 204 of FIG. 2 to provide the startup control signal from the startup circuit 206 to the load 208. In operation, when the startup enable signal goes high as shown in FIG. 4, the startup timing signal goes low after the next rising edge of the input clock to start the timing signal pulse. This also turns on the switch 718 to allow the startup circuit to provide a bias signal (i.e. the startup control signal) to the load. In parallel, the counter comes out of reset in response to the startup timing signal going low to start counting. After 16 clock cycles (for a 4 bit counter arrangement for example), the AND_out signal goes high, which clears the register 714. The "Q" output of the register 714 goes low to send the startup timing signal high, causing the switch 714 to turn off and block the startup control signal from the load.

The circuit may also be programmable to enable a startup timing signal having an adjustable width. For example, an OR gate 720 could optionally be implemented to generate set signals to registers of the counter to enable the counter to be set to generate a logical 1 as the AND_out signal. Counter control signals for controlling a count value, shown here by way of example as a 2 bit signal and a 3 bit signal, are coupled to inputs of an OR gate 720. While the startup timer would normally exhibit a 4 bit count (i.e. 16 clock cycles of the input clock), the inclusion of the "2 bit", "3 bit" inputs allows the count value to be programmed to be a 2-bit count (i.e. 4 clock cycles) or a 3-bit count (i.e. 8 clock cycles). For a 2-bit count, "2 bit" is set high to keep register 708 and register 706 in "SET" state (i.e. Q3/Q2=1). For 3-bit count, the "3 bit" is set high to keep register 708 in "SET" state (i.e. Q3=1). It should be noted that it is beneficial to ensure "2 bit" and "3 bit" are not simultaneously high to generate the correct count according to the Table 1.

While the counter of FIG. 7 represents an example of a digital counter that may be used, such as in a register transfer language (RTL) implementation to control the startup of a circuit, it should be understood that other counter circuits could be used, or other circuits for generating a timing signal having a predetermined duration could be used. Further, it should be understood that the circuit elements of FIG. 7 for generating the startup timing signal could be implemented in any of the figures requiring a startup timing signal, such as FIGS. 3, 5 and 6 for example.

Figure 8:
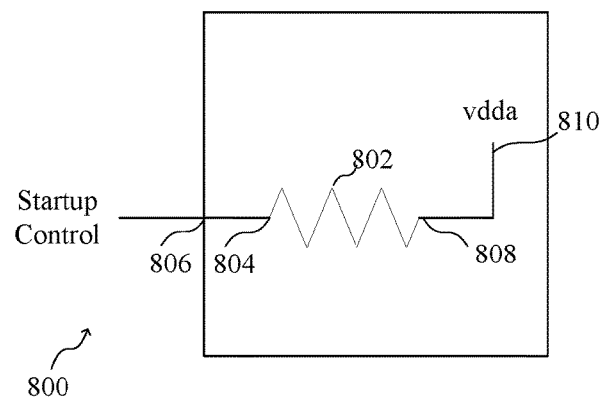
FIG. 8 is a block diagram of an exemplary startup circuit that could be implemented in an integrated circuit that may require startup control.

Turning now to FIG. 8, a block diagram of an exemplary startup circuit that could be implemented in an integrated circuit that may require startup control is shown. The startup circuit 800, which may be implemented as startup circuit 206 for example, comprises a resistor 802 having a first terminal 804 coupled to an output 806. A second terminal 808 is coupled to a node 810 that is adapted to receive a reference voltage, shown here by way of example as a vdda reference voltage. A startup control signal is generated at the output 806. As set forth above, the startup control signal could be any signal, such as a current or voltage, that could be used by a load during a startup. While the startup circuit 800 having a resistor is shown by way of example, it should be understood that any type of startup circuit for generating a startup control signal used by a load could be used.

Figure 9:
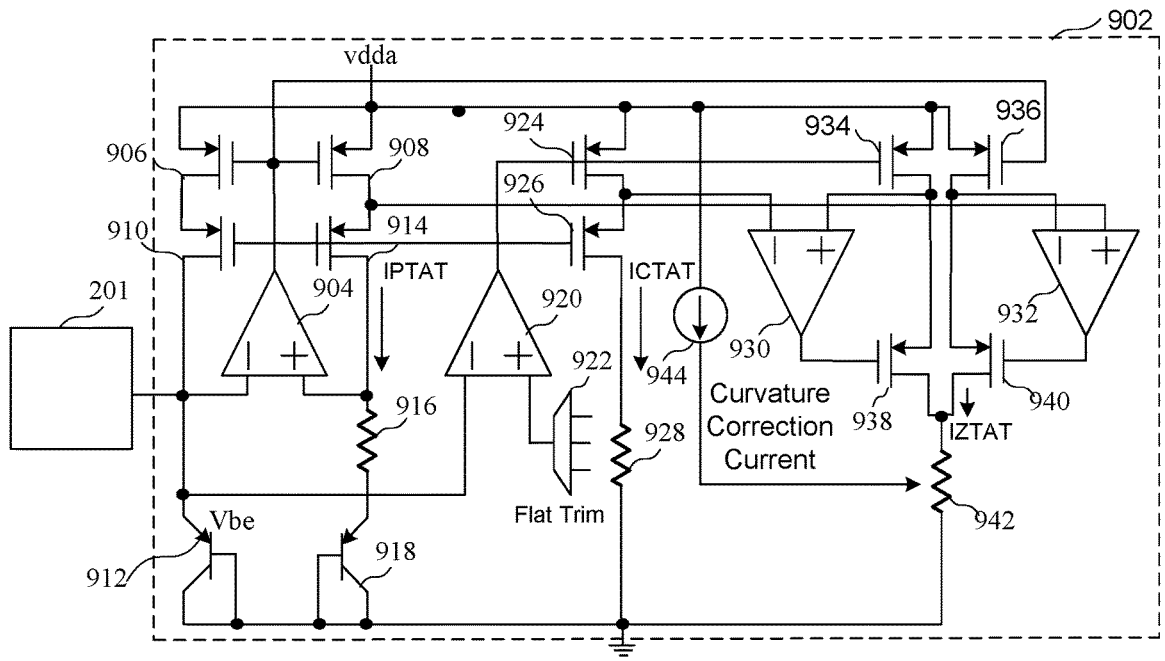
FIG. 9 is a block diagram of a circuit for providing startup control in a bandgap circuit of an integrated circuit device.

Turning now to FIG. 9, a block diagram of another circuit for providing startup control in an integrated circuit device is shown. According to the exemplary arrangement of FIG. 9, the startup control block 201 may be coupled to a bandgap circuit 902. The exemplary circuit arrangement of the bandgap circuit 902 comprises a plurality of current paths controlled by a plurality of amplifiers, including a first amplifier 904 having an output coupled to gates of a pair of transistors 906 and 908, shown here by way of example as a p-channel metal oxide semiconductor field effect transistor (MOSFET). The drain of transistor 906 is coupled in series to a transistor 910, the drain of which is coupled to a bi-polar junction transistor (BJT) 912. The transistor 908 is coupled in series to a transistor 914, the drain of which is coupled with a resistor 916 and another BJT transistor 918. The resistor 916 enables generating a positive-to-absolute temperature (PTAB) current. A first input is coupled to the output of the startup control block 201 (i.e. a startup control signal), and a second input coupled to the resistor 916.

A second amplifier 920 is configured to generate a complementary-to-absolute temperature (CTAT) current. More particularly, the amplifier 920 comprises a first input coupled to the output of the startup control block 201 and a second input coupled to an output of a multiplexer 922. The multiplexer 922 controls the temperature co-efficient at output, and more particularly controls amount of negative temperature coefficient current finally at output by providing Vbe/R (where R is controllable using multiplexer 922 and Vbe is a negative temperature coefficient). An output of the amplifier 920 is coupled to a gate of a transistor 924 coupled in series with a transistor 926, where the ICTAT current is generated through a resistor 928. The gates of the transistors 910, 914 and 926 could be biased by a reference voltage, such as by using a PMOS diode for example.

Third and fourth amplifiers 930 and 932 are configured to generate a zero temperature (ZTAT) current. More particularly, the third amplifier 930 comprises a first input coupled to a drain of the transistor 924 and a second input coupled to the drain 934. The amplifier 932 comprises a first input coupled to a drain of the transistor 908 and a second input coupled to a drain of a transistor 936. Outputs of the amplifiers 930 and 932 are coupled to control gates of transistors 938 and 940 to generate the IZTAT current at the drains of transistors 938 and 940 through a resistor 942. A curvature correction current generated by a current source 944 is generated to control the current through the variable resistor 942. The startup of the bandgap circuit 902 can be controlled by controlling the signal generated by the startup control block 201, as described above. More particularly, the amplifier 904 can be controlled during a startup period to ensure correct operation of the bandgap circuit 902.

Figure 10:
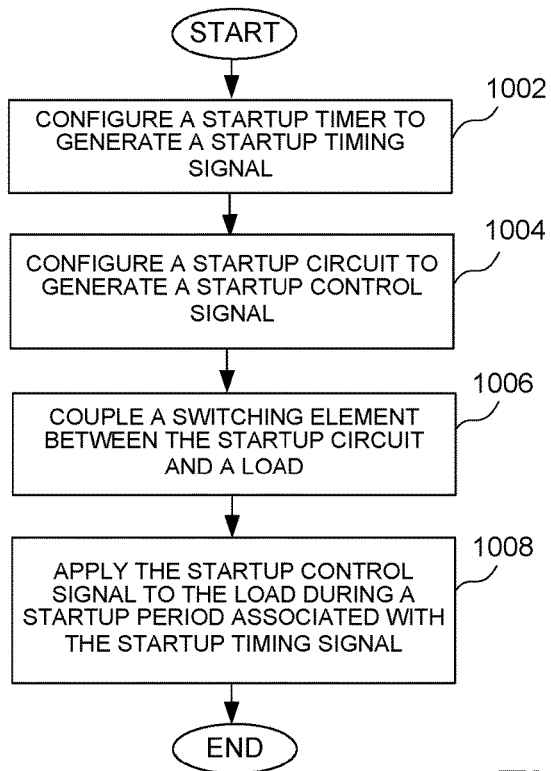
FIG. 10 is a flow chart showing a method of providing startup control in an integrated circuit device.

Turning now to FIG. 10, a flow chart shows a method of providing startup control in an integrated circuit device. More particularly, a startup timer, such as startup timer 202, is configured to generate a startup timing signal at a block 1002. A startup circuit, such as startup circuit 206, is configured to generate a startup control signal at a block 1004. A switching element, such as switching element 204, is coupled between the startup circuit and a load at a block 1006. The startup control signal is applied, by the switching element, to the load during a startup period associated with the startup timing signal at a block 1008.

The method may further comprise configuring a plurality of loads, and providing the load control signal to the plurality of loads. According to some implementations, the startup timer comprises configuring a digital time-based startup circuit, where the startup period may be based upon a worst-case startup time. The startup time may also be a programmable startup time. The method may further comprise enabling an open loop operation of the control circuit. According to some implementations, the load may comprise a voltage-to-current converter, and the startup control signal may comprise a startup injection current. According to further implementations, the load comprises a bandgap circuit or a bias block.

The method of FIG. 10 may be implemented using the circuits of FIGS. 1-9 as described, or using some other suitable circuits. While specific elements of the method are described, it should be understood that additional elements of the method, or additional details related to the elements, could be implemented according to the disclosure of FIGS. 1-9.

It can therefore be appreciated that new circuits for and methods of providing startup control in an integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A control circuit used in an integrated circuit device, the control circuit comprising:
   a startup timer configured to generate a startup timing signal;
   a startup circuit configured to generate a startup control signal; and
   a switching element coupled between the startup circuit and a load;
   wherein the switching element applies the startup control signal to the load during a startup period associated with the startup timing signal; and
   wherein the switching element prevents the startup control signal from being applied to the load after the startup period.

2. The control circuit of claim 1, further comprising a plurality of loads, wherein the startup timer and the startup circuit provide the startup control signal to the plurality of loads.

3. The control circuit of claim 1, wherein the startup timer comprises a time-based startup circuit.

4. The control circuit of claim 1, wherein the startup timing signal is based upon a known characteristic of the load.

5. The control circuit of claim 1, wherein the startup timing signal comprises a programmable startup time.

6. The control circuit of claim 1, wherein the control circuit enables an open loop operation of a startup of a circuit receiving the startup control signal.

7. The control circuit of claim 1, wherein the load comprises a voltage-to-current converter.

8. The control circuit of claim 7, wherein the startup control signal comprises a startup injection current.

9. The control circuit of claim 1, wherein the load comprises a bandgap circuit.

10. The control circuit of claim 1, wherein the load comprises a bias block.

11. A method of controlling an operation of an integrated circuit device, the method comprising:
   configuring a startup timer to generate a startup timing signal;
   configuring a startup circuit to generate a startup control signal; and
   coupling a switching element between the startup circuit and a load;
   wherein the switching element applies the startup control signal to the load during a startup period associated with the startup timing signal; and
   wherein the switching element prevents the startup control signal from being applied to the load after the startup period.

12. The method of claim 11, further comprising configuring a plurality of loads, and providing the startup control signal to the plurality of loads.

13. The method of claim 11, wherein configuring the startup timer comprises configuring a time-based startup circuit.

14. The method of claim 11, wherein the startup period is based upon a known characteristic of the load.

15. The method of claim 11, wherein the startup timing signal comprises a programmable startup time.

16. The method of claim 11, further comprising enabling an open loop operation of a circuit receiving the startup control signal.

17. The method of claim 11, wherein the load comprises a voltage-to-current converter.

18. The method of claim 17, wherein the startup control signal comprises a startup injection current.

19. The method of claim 11, wherein the load comprises a bandgap circuit.

20. The method of claim 11, wherein the load comprises a bias block.

* * * * *